United States Patent
Park et al.

(10) Patent No.: US 12,014,904 B2
(45) Date of Patent: Jun. 18, 2024

(54) WAFER PROCESSING APPARATUS

(71) Applicant: Samsung Electronics Co., Ltd., Suwon-si (KR)

(72) Inventors: Jongchul Park, Seoul (KR); Hyonwook Ra, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 288 days.

(21) Appl. No.: 17/370,766

(22) Filed: Jul. 8, 2021

(65) Prior Publication Data
US 2022/0172930 A1 Jun. 2, 2022

(30) Foreign Application Priority Data
Dec. 1, 2020 (KR) .................. 10-2020-0166005

(51) Int. Cl.
*H01J 37/32* (2006.01)
*H01L 21/3213* (2006.01)

(52) U.S. Cl.
CPC .. *H01J 37/32568* (2013.01); *H01J 37/32422* (2013.01); *H01J 37/32715* (2013.01); *H01J 37/32082* (2013.01); *H01J 2237/2007* (2013.01); *H01L 21/32136* (2013.01)

(58) Field of Classification Search
None
See application file for complete search history.

(56) References Cited

U.S. PATENT DOCUMENTS

| 7,285,788 B2 | 10/2007 | Lee et al. |
| 8,450,680 B2 | 5/2013 | Lee et al. |
| 9,257,295 B2 | 2/2016 | Singh et al. |
| 10,347,459 B2 | 7/2019 | Park |
| 10,522,351 B2 | 12/2019 | Park |
| 10,600,653 B2 | 3/2020 | Bai et al. |
| 10,916,403 B2 | 2/2021 | Park |
| 2008/0132046 A1* | 6/2008 | Walther ............ H01J 37/08 438/513 |
| 2009/0140132 A1* | 6/2009 | Lee ............ H01J 37/30 250/251 |
| 2015/0179409 A1* | 6/2015 | Biloiu ............ H01J 37/32422 427/523 |

(Continued)

FOREIGN PATENT DOCUMENTS

| CN | 110189987 A | 8/2019 |
| JP | 5246474 B2 | 7/2013 |

(Continued)

*Primary Examiner* — Ram N Kackar
*Assistant Examiner* — Laureen Chan
(74) *Attorney, Agent, or Firm* — Muir Patent Law, PLLC

(57) ABSTRACT

A wafer processing apparatus is provided. The wafer processing apparatus includes a chamber body defining a plasma region configured that plasma is generated in the plasma region, a wafer support arranged in the chamber body and configured to support a wafer, first and second electrodes arranged between the wafer support and the plasma region and having apertures configured to guide a path of ions of the plasma, a first power source configured to apply, to the first electrode, a voltage that is higher than a voltage applied to the second electrode, and a second power source configured to apply, to the wafer support, a voltage that is higher than the voltage applied to the second electrode.

20 Claims, 12 Drawing Sheets

(56) References Cited

U.S. PATENT DOCUMENTS

| | | | | |
|---|---|---|---|---|
| 2015/0255243 A1* | 9/2015 | Godet | ............... | H01J 37/32899 |
| | | | | 156/345.39 |
| 2016/0064232 A1* | 3/2016 | Berry, III | ............ | H01J 37/3053 |
| | | | | 438/712 |
| 2020/0185201 A1* | 6/2020 | Kurunczi | .............. | H01J 37/147 |

FOREIGN PATENT DOCUMENTS

| | | | |
|---|---|---|---|
| KR | 10-2018-0065072 A | 6/2018 | |
| KR | 10-2019-0021511 A | 3/2019 | |

* cited by examiner

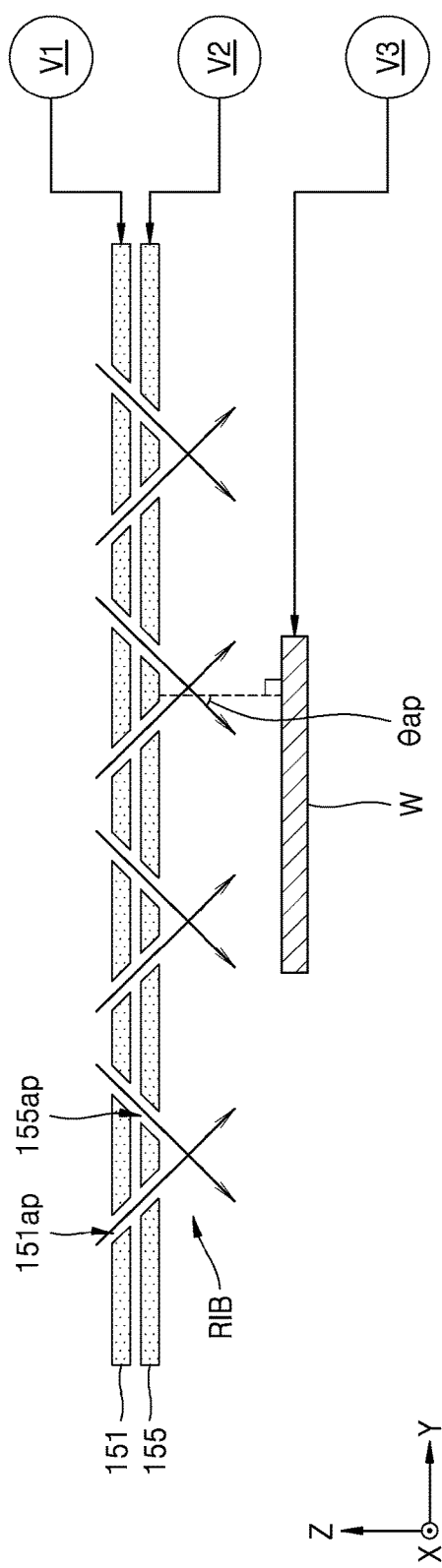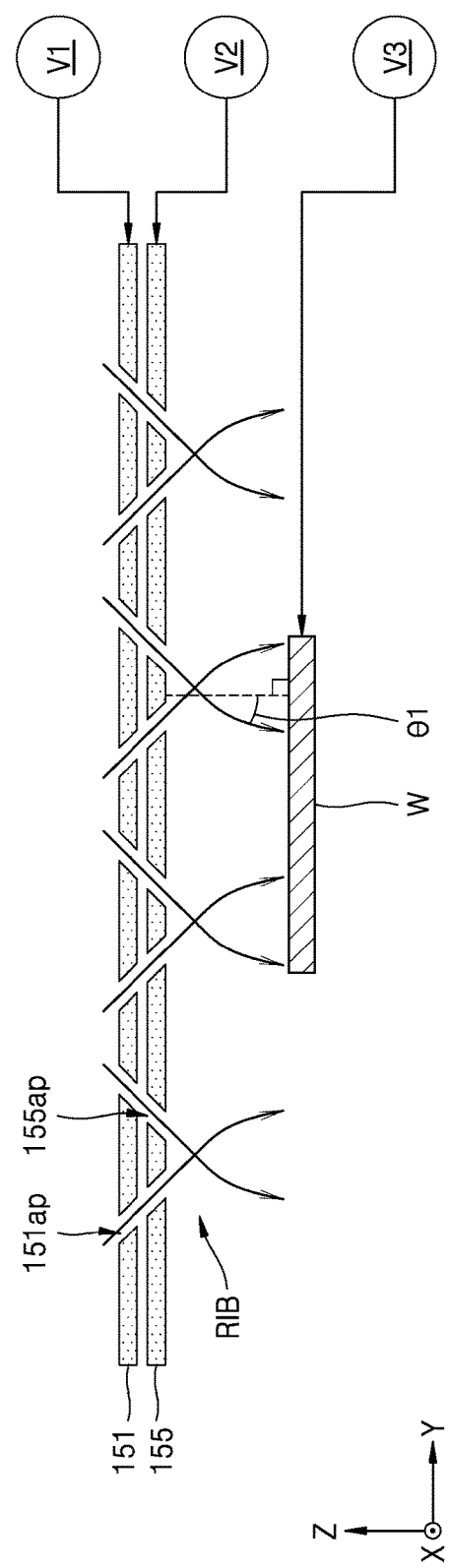

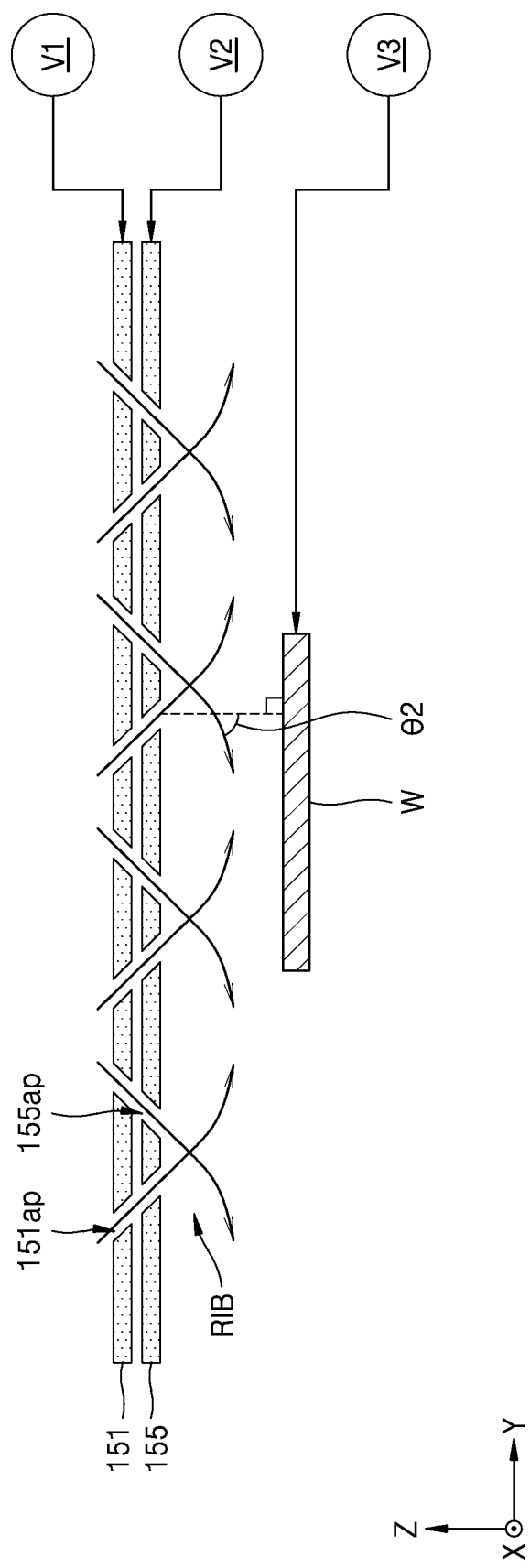

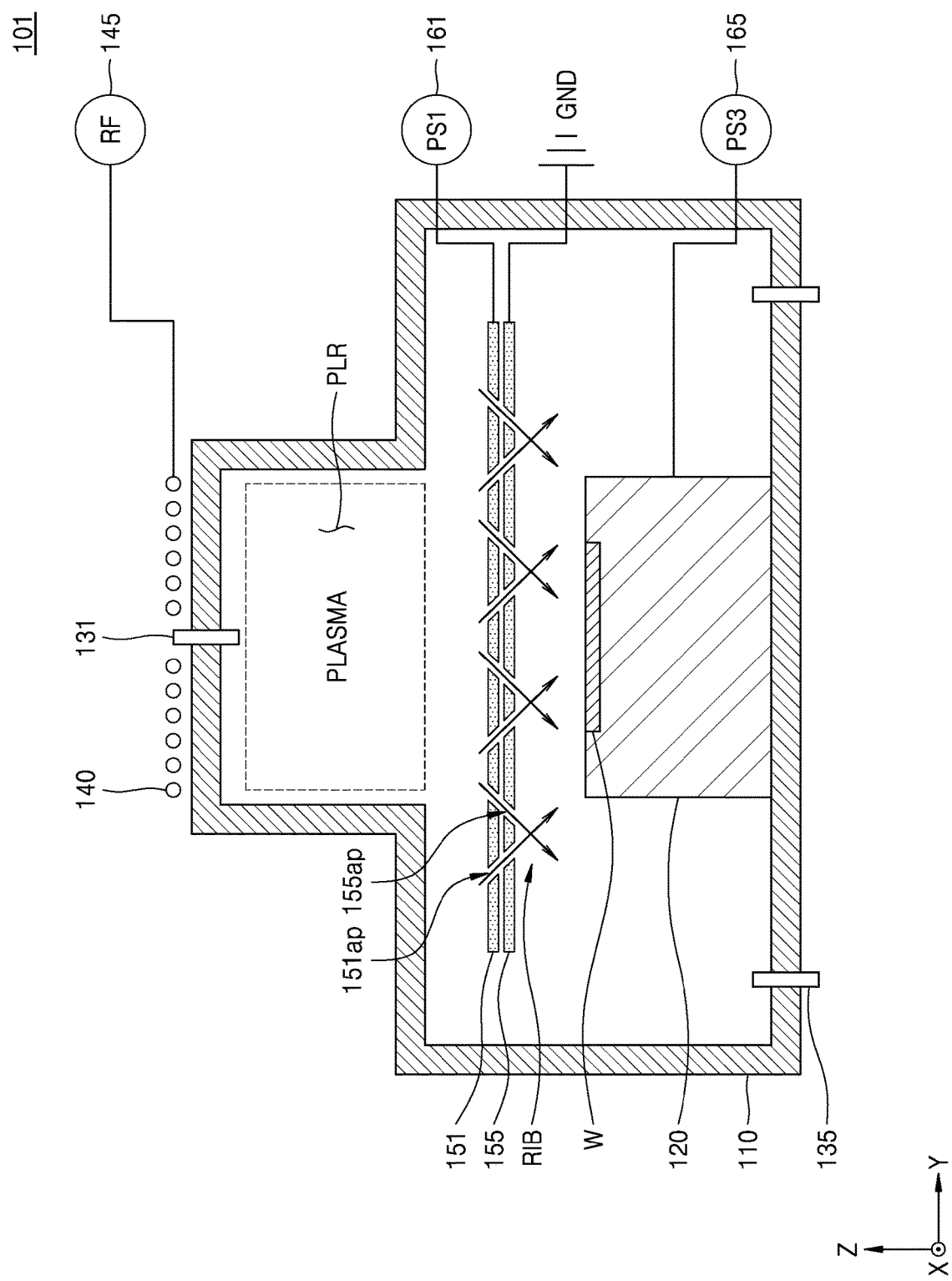

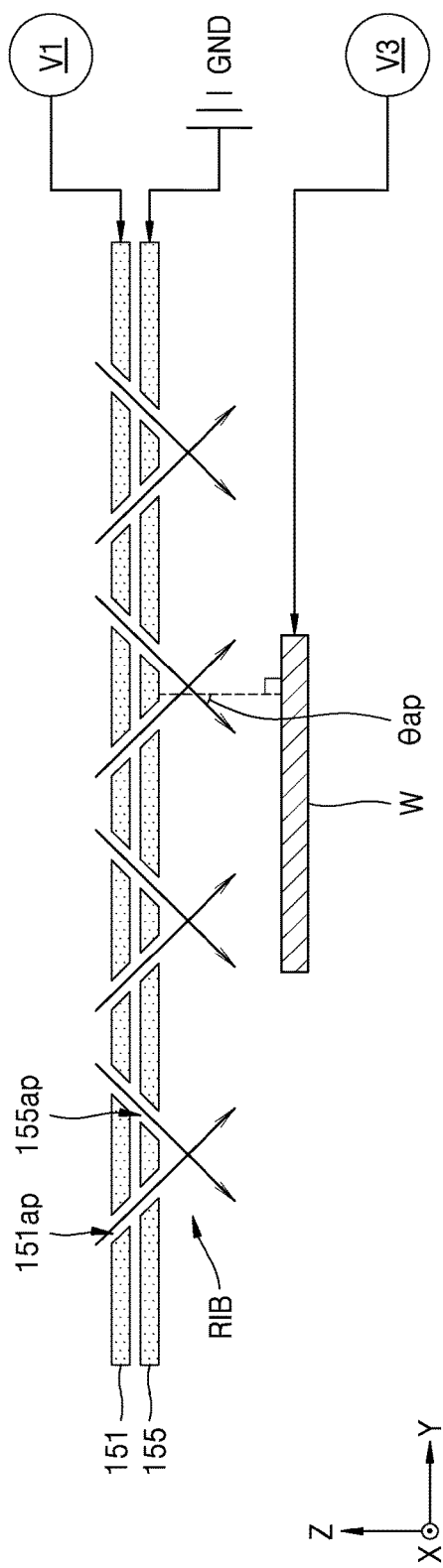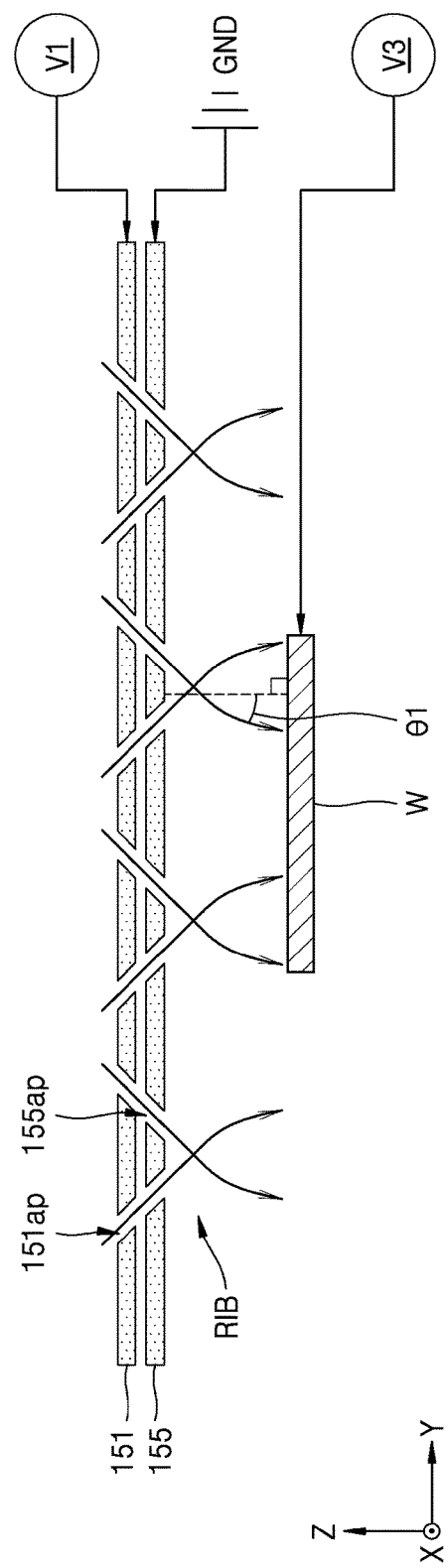

WAFER PROCESSING APPARATUS

CROSS-REFERENCE TO RELATED APPLICATION

This application is based on and claims priority under 35 U.S.C. § 119 to Korean Patent Application No. 10-2020-0166005, filed on Dec. 1, 2020, in the Korean Intellectual Property Office, the disclosure of which is incorporated by reference herein in its entirety.

BACKGROUND

The inventive concept relates to a wafer processing apparatus.

Semiconductor devices are formed using various semiconductor manufacturing processes such as a deposition process, an ion implantation process, a photolithography process, and an etching process. As semiconductor devices are highly integrated, line widths of patterns and distances between patterns included in the semiconductor devices are decreasing, and ultra-fine bridge defects that did not cause device defects in the past have caused device failure through short circuits and openings. Accordingly, various methods of suppressing bridge defects in an etching process for pattern formation and improving the reliability of semiconductor devices have been studied.

SUMMARY

The inventive concept provides a wafer processing apparatus with improved reliability.

According to an aspect of the inventive concept, there is provided a wafer processing apparatus. The wafer processing apparatus includes a chamber body defining a plasma region configured that plasma is generated in the plasma region, a wafer support arranged in the chamber body and configured to support a wafer, first and second electrodes arranged between the wafer support and the plasma region and having apertures configured to guide a path of ions of the plasma, a first power source configured to apply a voltage, to the first electrode, higher than a voltage applied to the second electrode, and a second power source configured to apply, to the wafer support, a voltage that is higher than the voltage applied to the second electrode.

According to another aspect of the inventive concept, there is provided a wafer processing apparatus configured to perform a wafer etching process using a reactive ion beam. The wafer processing apparatus includes a chamber body defining a chamber, the chamber body configured that a wafer is arranged in the chamber, the chamber body defining a plasma region configured that plasma is generated in the plasma region, first and second electrodes arranged between the plasma region and a wafer support configured to receive the wafer, the first and second apertures having apertures configured to guide a path of ions of the plasma, a radio frequency (RF) power source configured to provide RF power to generate the plasma, a first power source configured to apply a first voltage to the first electrode to generate the reactive ion beam by accelerating positive ions of the plasma, and a second power source configured to apply a second voltage to the wafer to control a path of the reactive ion beam.

According to another aspect of the inventive concept, there is provided a wafer processing apparatus configured to make a reactive ion beam be incident on a wafer at different first to third angles with respect to a first direction perpendicular to an upper surface of the wafer. The wafer processing apparatus includes a chamber body defining a plasma region configured that plasma is formed in the plasma region, a wafer support arranged in the chamber body and configured to support and fix the wafer, first and second electrodes arranged between the wafer support and the plasma region and having apertures configured to guide a path of ions of the plasma, a first power source electrically connected to the first electrode, and a second power source electrically connected to the wafer support, wherein the second power source is configured to apply voltages of at least three different levels to the wafer through the wafer support.

BRIEF DESCRIPTION OF THE DRAWINGS

Embodiments of the inventive concept will be more clearly understood from the following detailed description taken in conjunction with the accompanying drawings in which:

FIGS. 2A to 2C are diagrams illustrating the operation of a wafer processing apparatus according to example embodiments;

FIGS. 6 to 7C are diagrams illustrating a wafer processing apparatus according to example embodiments;

DETAILED DESCRIPTION OF THE EMBODIMENTS

Figure 1:
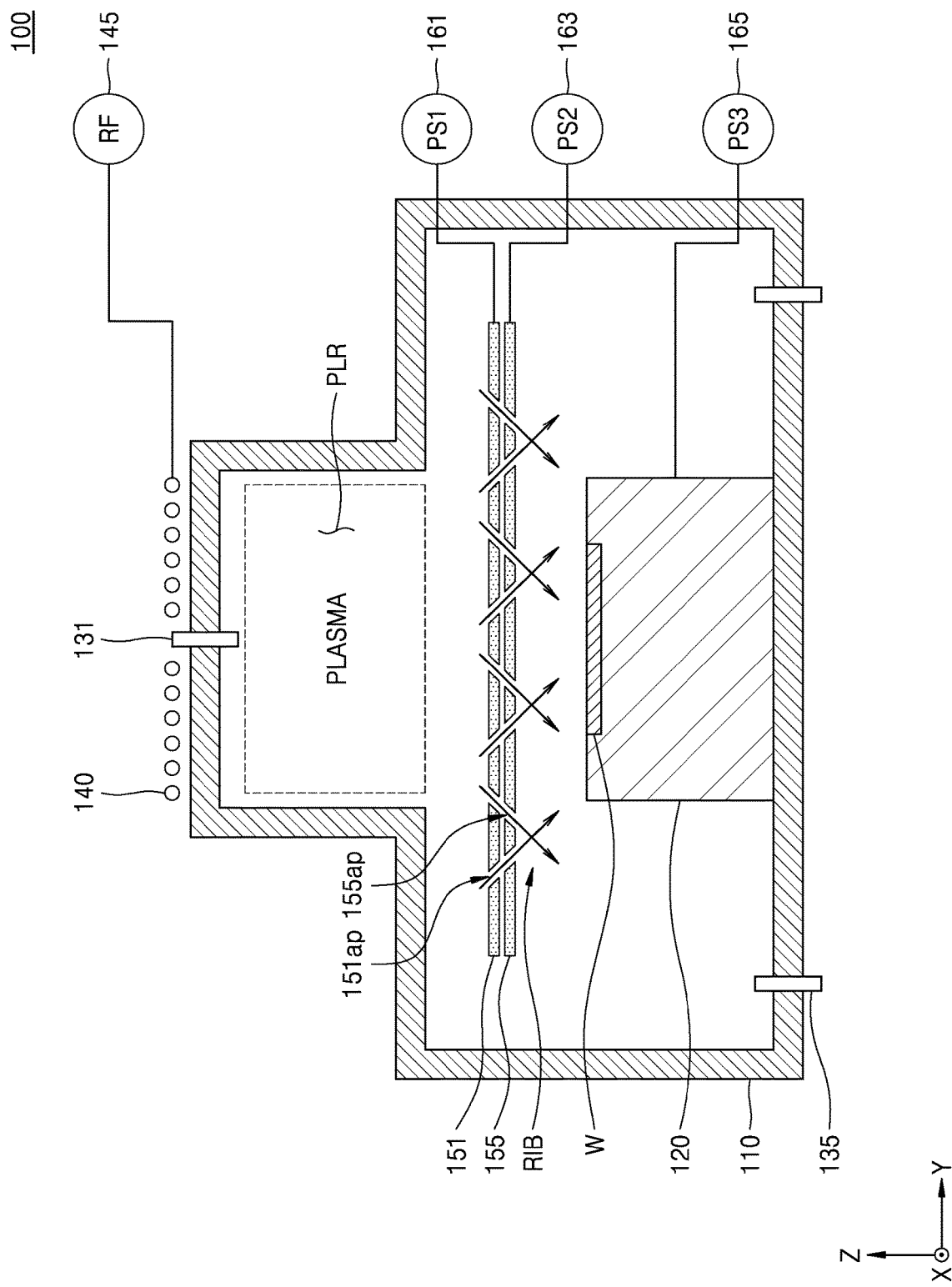
FIG. 1 is a diagram illustrating a wafer processing apparatus according to example embodiments.

Hereinafter, embodiments of the inventive concept will be described in detail with reference to the accompanying drawings. The same reference numeral is used for the same components in the drawings, and redundant descriptions thereof are omitted.

FIG. 1 is a diagram illustrating a wafer processing apparatus 100 according to example embodiments.

Referring to FIG. 1, the wafer processing apparatus 100 may include a chamber body 110, a wafer support 120, a gas inlet 131, a gas exhaust 135, a plasma generator 140, a radio frequency (RF) power source 145, first and second electrodes 151 and 155, and first to third power sources 161, 163, and 165.

The wafer processing apparatus 100 may be an apparatus for generating plasma and processing a wafer W by using the plasma. The wafer processing apparatus 100 may perform an etching process on the wafer W. The wafer processing apparatus 100 may perform, for example, a reactive ion etching process. Reactive ion etching is a dry etching process in which species (radicals, ions, or the like) excited by a high frequency RF power source etch a substrate or thin film in a low pressure chamber. The reactive ion etching may be performed by a complex action of a bombardment of energetic ions and chemical reaction of chemically active species.

The wafer W may include and/or be formed of, for example, silicon (Si). The wafer W may include and/or be formed of a semiconductor element such as germanium (Ge), or a compound semiconductor such as silicon carbide (SiC), gallium arsenide (GaAs), indium arsenide (InAs), or indium phosphide (InP). According to some embodiments, the wafer W may have a silicon on insulator (SOI) structure. The wafer W may include a buried oxide layer. According to some embodiments, the wafer W may include a conductive region, for example, a well doped with impurities. According to some embodiments, the wafer W may have various device isolation structures such as a shallow trench isolation (STI) structure separating doped wells. The wafer W may have a first surface, e.g., an active surface and a second surface, e.g., an inactive surface opposite to the first surface. The wafer W may be arranged on the wafer support 120 such that the second surface thereof faces the wafer support 120.

Here, two directions parallel to the first surface of the wafer W and perpendicular to each other are respectively defined as an X direction and a Y direction, and a direction perpendicular to the first surface of the wafer W is defined as a Z direction. Unless otherwise stated, the definition of the directions is the same in the following drawings.

The chamber body 110 may provide an inner space for processing the wafer W. The chamber body 110 may separate the inner space for the processing from the outside. The chamber body 110 may be a clean room facility capable of controlling pressure and temperature with high precision. The chamber body 110 may include a plasma region PLR in which plasma is generated based on a process gas. The inner space defined by the chamber body 110 may be rotationally symmetric with respect to the Z direction, but is not limited thereto. According to example embodiments, a reference potential may be applied to the chamber body 110 to electrically separate a process space in the chamber from the outside.

The wafer processing apparatus 100 may perform first and second etching processes, which are different from each other, on the wafer W. Each of the first and second etching processes may be a directional etching process. The first etching process may be, for example, an etching process using reactive ion beams RIB incident on the wafer W at a low angle with respect to the Z direction. The second etching process may be, for example, an etching process using reactive ion beams RIB incident on the wafer W at a high angle with respect to the Z direction. For example, with respect to the Z direction, the reactive ion beams RIB of the second etching process may be incident on the wafer W at a higher angle than the angle at which the reactive ion beams RIB of the first etching process are incident on the wafer W.

The wafer support 120 may support the wafer W. The wafer support 120 may include an electrostatic chuck that fixes/holds the wafer W thereto by static power. A heater for setting the temperature of the wafer W may be provided inside the wafer support 120. The wafer support 120 may select the first and second etching processes by setting the voltage of the wafer W. For example, a controller, which will be described below, may set the voltage of the wafer W to select the first or second etching process.

The gas inlet 131 may supply a process gas into a chamber enclosed by the chamber body 110. The process gas may be a source gas for generating reactive ions. The type and pressure of the process gas may vary depending on the composition of a material film to be etched. For example, $CHF_3$ and $O_2$ may be used as process gases for etching amorphous silicon, $CHF_3$ and $O_2$ may also be used as process gases for etching silicon nitride, and $CF_4$ and $O_2$ may be used as process gases for etching silicon oxide.

The gas exhaust 135 may be connected to a pump such as a turbo molecular pump or a dry pump, and may adjust the pressure inside the chamber body 110. The turbo molecular pump is of a type of vacuum pump similar to a turbo pump, and may secure and maintain a vacuum. The turbo molecular pump may include, for example, a fast rotating fan rotor. The turbo molecular pump may provide a high vacuum pressure by controlling the magnitude and direction of the momentum of gas molecules by using the fan rotor. Unlike an oil diffusion pump, the dry pump may not include oil that performs sealing and lubricating functions to maintain a vacuum formed in a process chamber. The dry pump may provide a vacuum of approximately $10^{-2}$ mbar and have the advantage of high vacuum cleanliness. The dry pump may be, for example, one of a claw pump, a multi stage roots pump, a roots and claw combination pump, a scroll pump, a screw pump, a diaphragm pump, and a molecular drag pump.

According to example embodiments, the plasma generator 140 may include a coil. The plasma generator 140 may apply a magnetic field, an electric field or an electromagnetic filed to the process gas supplied to a plasma region based on RF power supplied from the RF power source 145. Accordingly, plasma may be generated in the plasma region PLR in the chamber body 110, as indicated by a dashed line in FIG. 1.

According to example embodiments, ions of the plasma may be accelerated by a potential difference between the first electrode 151 and the second electrode 155 to enter/hit the wafer W in the form of reactive ion beams RIB. According to example embodiments, apertures 151ap and 155ap arranged in a line may be formed in the first and second electrodes 151 and 155, and the path of the reactive ion beams RIB may be confined by the apertures 151ap and 155ap. For example, the first electrode 151 may include a plurality of first apertures 151ap and the second electrode 155 may include a plurality of second apertures 155ap, and each of the first apertures 151ap may be aligned with a corresponding second aperture 155ap for the reactive ion beams RIB to be consistently guided by the first and second apertures 151ap and 155ap. For example, each of the first apertures 151ap may have a central axis overlapping with a central axis of a corresponding second aperture 155ap.

According to example embodiments, a first power source 161 may apply a voltage to the first electrode 151, a second power source 163 may apply a voltage to the second electrode 155, and a third power source 165 may apply a voltage to the wafer support 120 and the wafer W. The first power source 161 and the second power source 163 may accelerate positive ions of the plasma to form the reactive ion beams RIB, and the third power source 165 may control the path/direction of the reactive ion beams RIB. According to example embodiments, the third power source 165 may be a variable voltage source that outputs voltages of at least three or more levels. Control of the path of the reactive ion beams RIB by the first to third power sources 161, 163, and 165 will be described later with reference to FIGS. 2A to 2C.

The wafer processing apparatus 100, which is a plasma processing apparatus, may further include a controller for controlling the overall operation of the wafer processing apparatus 100. The controller may control, for example, the inflow and outflow of the process gas, thereby controlling the composition of gas and pressure in the chamber, the application of RF power by the RF power source 145, and the application of a bias voltage by the first to third power sources 161, 163, and 165.

The controller may include a memory and a processor for processing a command stored in the memory or an external control signal. The controller may be implemented in hardware, firmware, software, or any combination thereof. For example, the processor may include and/or may be a computing device such as a workstation computer, a desktop computer, a laptop computer, or a tablet computer. The controller may include and/or may be a simple controller, a microprocessor, a complex processor such as a central processing unit (CPU) or a graphics processing unit (GPU), a processor configured by software, dedicated hardware, or firmware. The controller may be implemented by, for example, a general purpose computer or application specific hardware such as a digital signal processor (DSP), a field programmable gate array (FPGA), or an application specific integrated circuit (ASIC).

According to some embodiments, the operation of the controller may be implemented as instructions stored on a machine-readable medium that may be read and executed by one or more processors. In this case, the machine-readable medium may include any mechanism for storing and/or transmitting information in a form readable by a machine (e.g., a computing device). For example, the machine-readable medium may include and/or may be a read only memory (ROM), a random access memory (RAM), a magnetic disk storage medium, an optical storage medium, a flash memory device. For example, the machine-readable medium may use electrical, optical, acoustic, or other forms of radio signals (e.g., carrier waves, infrared signals, and digital signals), and other arbitrary signals.

In addition, firmware, software, routines, and instructions for performing the operation described with respect to the controller or any process described below may be configured, e.g., in the controller or another component. For example, the controller may be implemented by software that generates a signal for controlling the pressure in the wafer processing apparatus 100. However, this is for convenience of description, and the operations of the above-described memory and processor may be performed by a computing device, a processor, a controller, or another device that executes firmware, software, routines, instructions, and the like.

FIGS. 2A to 2C are diagrams illustrating the operation of the wafer processing apparatus 100 according to example embodiments.

Referring to FIGS. 1 and 2A, a first voltage V1 may be applied to the first electrode 151 by the first power source 161, and a second voltage V2 may be applied to the second electrode 155 by the second power source 163.

According to example embodiments, the average kinetic energy of the reactive ion beams RIB may be determined by the first and second voltages V1 and V2. For example, the first voltage V1 may be higher than the second voltage V2, and ions of the plasma may be accelerated by an electric field generated by a voltage difference between the first voltage V1 and the second voltage V2.

The third voltage V3 may be applied to the wafer W via the wafer support 120 by the third power source 165. In FIG. 2A, the third voltage V3 may be substantially the same as the second voltage V2. Accordingly, an electric field may not be substantially formed between the second electrode 155 and the wafer W, and the reactive ion beams RIB incident on the wafer W may travel substantially straight between the second electrode 155 and the wafer W. Accordingly, the reactive ion beams RIB may enter/hit the wafer W at an angle the same as a directional angle $\theta ap$ of the apertures 151*ap* and 155*ap* formed in the first and second electrodes 151 and 155. For example, the directional angle $\theta ap$ of the apertures 151*ap* and 155*ap* may be an angle between a central axis of the apertures 151*ap* and 155*ap* and a line perpendicular to a top surface of the wafer W as shown in FIG. 2A. For example, the central axis of the apertures 151*ap* and 155*ap* may be parallel with an extending direction of the apertures 151*ap* and 155*ap*.

Terms such as "same," "equal," "planar," "straight," or "coplanar," as used herein encompass identicality or near identicality including variations that may occur, for example, due to manufacturing processes. The term "substantially" may be used herein to emphasize this meaning, unless the context or other statements indicate otherwise.

Referring to FIGS. 1 and 2B, the first voltage V1 may be higher than the second voltage V2 as in FIG. 2A, and due to a voltage difference between the first voltage V1 and the second voltage V2, positive ions of the plasma may be accelerated to thereby form reactive ion beams RIB. The third voltage V3 may be lower than the second voltage V2, and an electric field toward the wafer W may be formed between the second electrode 155 and the wafer W. Accordingly, the reactive ion beams RIB may be accelerated in a direction approaching the wafer W along the Z direction, and a first angle $\theta 1$, which is an angle between the Z direction and an incidence direction of the reactive ion beams RIB, may be less than the directional angle $\theta ap$ (refer to FIG. 2A) of the apertures 151*ap* and 155*ap*.

According to example embodiments, the wafer processing apparatus 100 may adjust the third voltage V3 applied to the wafer W so that the reactive ion beams RIB may be incident on the wafer W in a direction substantially perpendicular to the wafer W.

Referring to FIGS. 1 and 2C, the first voltage V1 may be higher than the second voltage V2 as in FIG. 2A, and due to a voltage difference between the first voltage V1 and the second voltage V2, positive ions of the plasma may be accelerated to thereby form reactive ion beams RIB. The third voltage V3 may be higher than the second voltage V2, and an electric field in a direction receding from the wafer W may be formed between the second electrode 155 and the wafer W. Accordingly, the reactive ion beams RIB may be decelerated with respect to a direction approaching the wafer W in the Z direction, and a second angle $\theta 2$, which is an angle between the Z direction and an incidence direction of the reactive ion beams RIB, may be greater than the directional angle $\theta ap$ (refer to FIG. 2A) of the apertures 151*ap* and 155*ap*.

According to example embodiments, the wafer processing apparatus 100 may adjust the third voltage V3 applied to the wafer W so that the reactive ion beams RIB may be incident on the wafer W at a high angle with respect to the Z direction.

Figure 3:
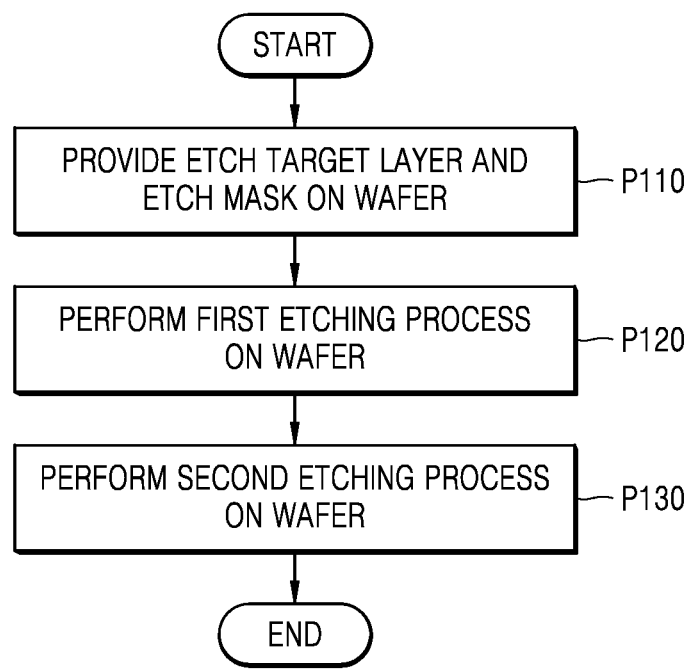
FIG. 3 is a flowchart illustrating a method of manufacturing a semiconductor device, according to example embodiments.

FIG. 3 is a flowchart illustrating a method of manufacturing a semiconductor device, according to example embodiments.

Figure 4A:
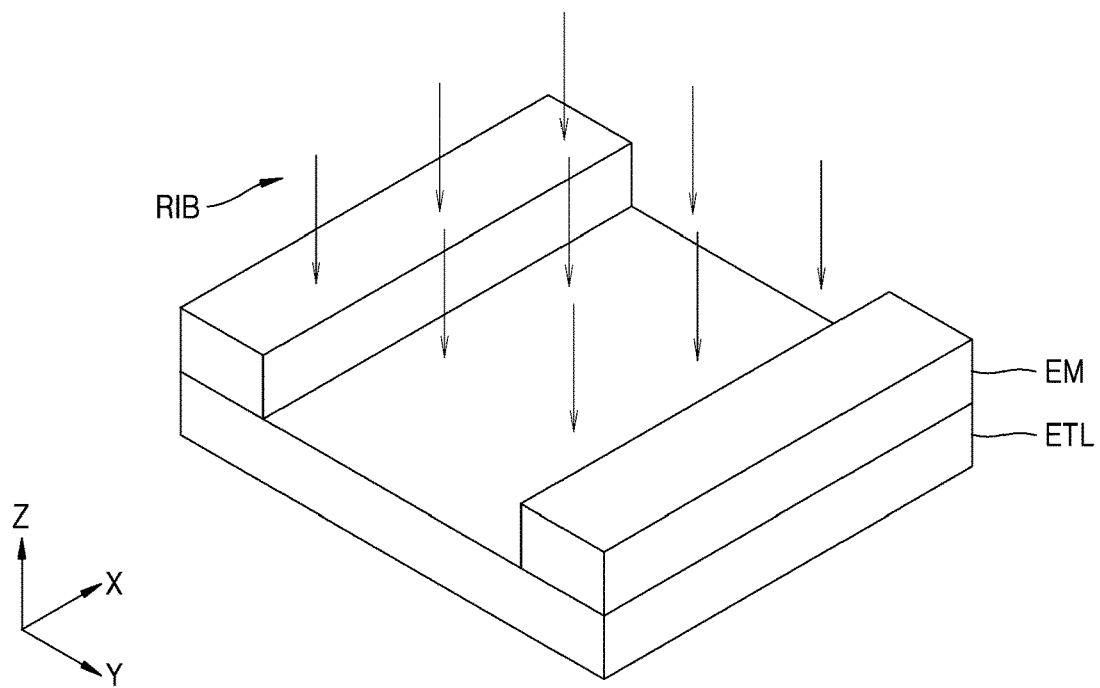
FIGS. 4A to 4C are perspective views illustrating a method of manufacturing a semiconductor device, according to example embodiments.
Figure 4B:
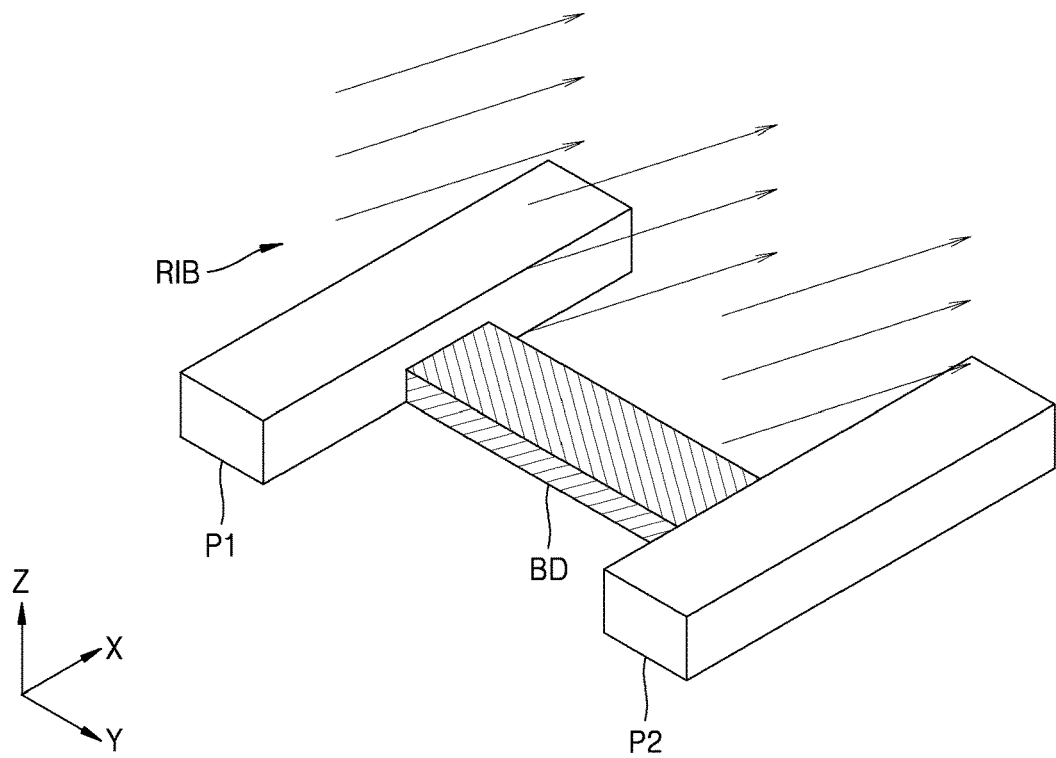
Figure 4C:
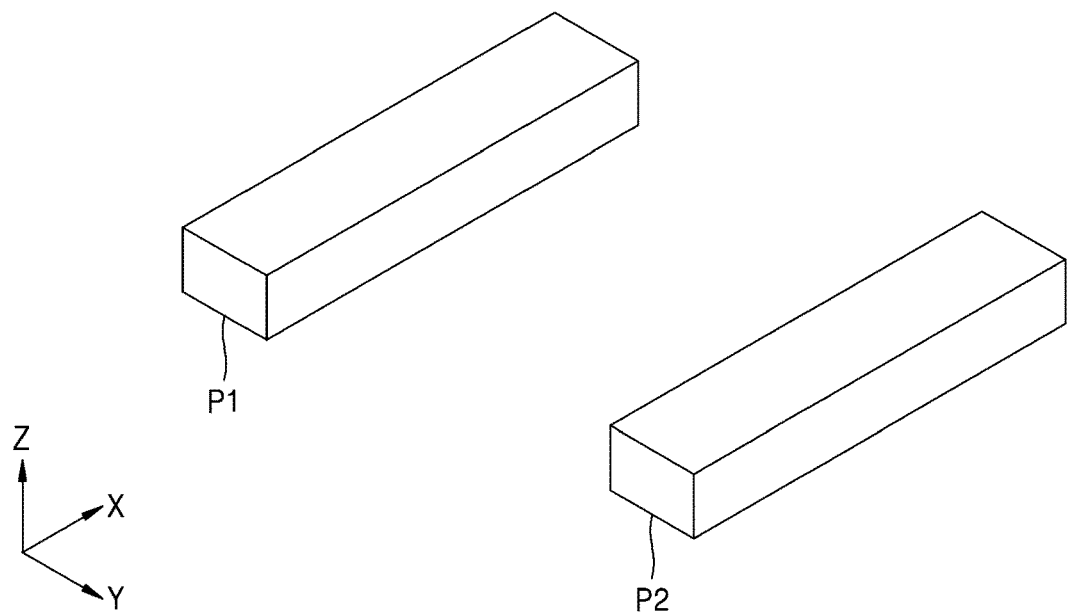

FIGS. 4A to 4C are perspective views illustrating a method of manufacturing a semiconductor device, according to example embodiments.

According to FIGS. 3 and 4A, an etch target layer ETL and an etch mask EM may be provided on a wafer W (refer to FIG. 1) in operation P110.

The etch target layer ETL may include and/or be formed of any one of a semiconductor material such as doped or undoped amorphous silicon, polycrystalline silicon, or crystalline silicon, an insulating material such as silicon oxide, silicon nitride, or silicon oxynitride, and a conductive metal material.

The etch mask EM may be formed through, for example, a lithography process. In the lithography process, a photoresist material may be formed on the etch target layer ETL, e.g., through a spin coating process, and then the photoresist material may be exposed and developed to provide the etch mask EM having a certain pattern. After the formation of a photoresist layer through the spin coating process, an edge bead removal process in which an edge bead formed on the edge of the wafer W is removed with a solvent and a laser may be further performed. Depending on the thickness of the etch target layer ETL, a hard mask including an amorphous carbon layer and a silicon oxynitride layer may be further provided between the etch mask EM and the etch target layer ETL.

Subsequently, referring to FIGS. 2B and 3 to 4B, a first etching process may be performed in operation P120.

According to example embodiments, in the first etching process, the reactive ion beams RIB may be irradiated at a first angle θ1 with respect to the Z direction, and accordingly, a portion of the etch target layer ETL exposed by the etch mask EM may be etched.

According to example embodiments, the third voltage V3 applied to the wafer W while the first etching process is performed may be lower than the second voltage V2 applied to the second electrode 155, as shown in FIG. 2B. Accordingly, the reactive ion beams RIB may be incident on the wafer W at a first angle θ1 close to the Z direction, and a pattern formed on the etch mask EM may be transferred to the etch target layer ETL and thus first and second patterns P1 and P2 extending in the X direction may be formed.

In this case, as the distance between the first pattern P1 and the second pattern P2 becomes extremely close due to the miniaturization of processes, a bridge defect BD, which extends in a direction (e.g., the Y direction) perpendicular to an extension direction of the first and second patterns P1 and P2 and is connected to the first and second patterns P1 and P2, may be formed between the first pattern P1 and the second pattern P2. The bridge defect BD may cause an unintended short circuit or opening, and thus may cause a device failure.

Next, referring to FIGS. 2B, 3, 4B, and 4C, a second etching process may be performed on the wafer W in operation P130.

According to example embodiments, in the second etching process, the reactive ion beams RIB may be irradiated at a second angle θ2 with respect to the Z direction, and accordingly, the bridge defect BD may be removed without damaging the first and second patterns P1 and P2.

According to example embodiments, the third voltage V3 applied to the wafer W while the second etching process is performed may be higher than the second voltage V2 applied to the second electrode 155, as shown in FIG. 2C. Accordingly, the reactive ion beams RIB may enter/hit the wafer W at the second angle θ2.

Figure 5A:
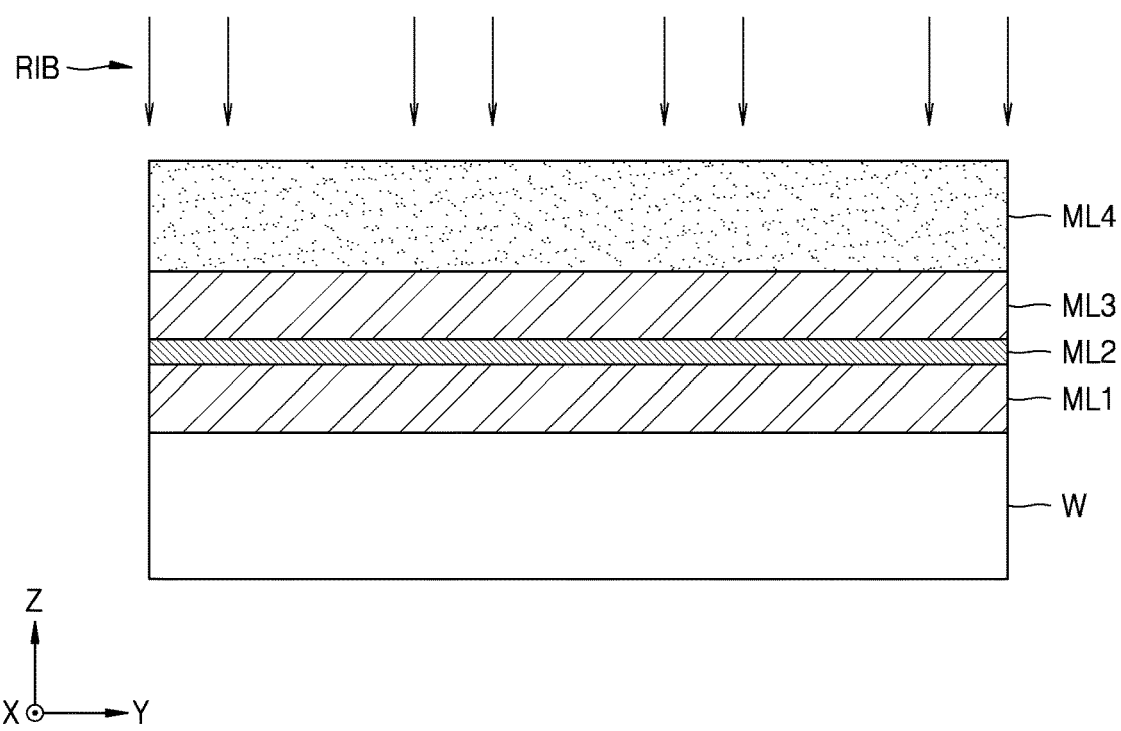
FIGS. 5A to 5C are cross-sectional views illustrating a method of manufacturing a semiconductor device, according to example embodiments.
Figure 5B:
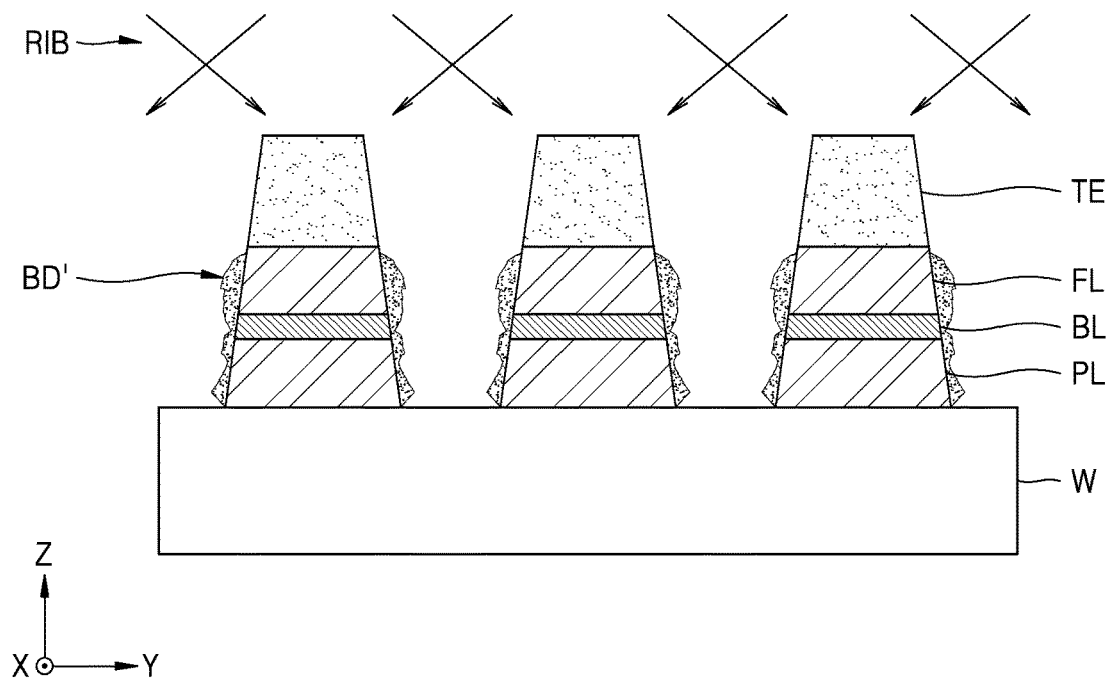
Figure 5C:
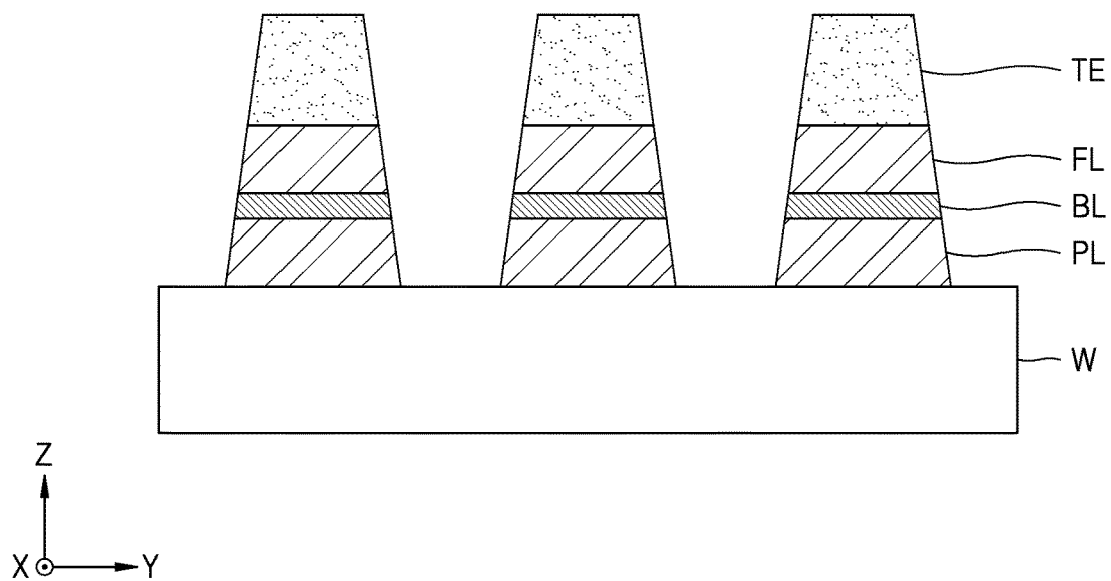

FIGS. 5A to 5C are cross-sectional views illustrating a method of manufacturing a semiconductor device, according to example embodiments.

Referring to FIG. 5A, first to fourth material layers ML1, ML2, ML3, and ML4 may be formed on a wafer W.

Although not shown, a transistor, a wiring layer, and a device isolation layer for defining an active region may be formed in the wafer W.

The first material layer ML1 may include and/or be formed of a magnetic material. The first material layer ML1 may include and/or be formed of, for example, CoFeB, CoFe, NiFe, FePt, or CoPt. According to example embodiments, the first material layer ML1 may include and/or may be a synthetic anti-ferromagnetic (SAF) layer, but is not limited thereto. For example, the first material layer ML1 may be configured/formed as a single layer. The first material layer ML1 may be formed by a molecular beam epitaxy (MBE) process or a metal organic chemical vapor deposition (MOCVD) process. The first material layer ML1 may be formed under a relatively low temperature of about 200° C. to about 400° C.

The second material layer ML2 may include and/or be formed of a metal, an alloy, a metal oxide, a metal nitride, a metal oxynitride, or a combination thereof. According to some embodiments, the second material layer ML2 may include and/or be formed of a transition metal. According to some embodiments, the second material layer ML2 may include and/or be formed of a material such as Mo, W, Ta, Ti, Zr, Hf, V, Nb, or an alloy thereof. The second material layer ML2 may be provided by a process such as atomic layer deposition (ALD) or sputtering.

The third material layer ML3 may include and/or be formed of a ferromagnetic material. The third material layer ML3 has a magnetic easy-axis in a direction perpendicular to the upper surface of the third material layer ML3. In some embodiments, the third material layer ML3 may include and/or may be a single layer or multiple layers including a material represented by $Co_aFe_bB_cZ_{(1-a-b-c)}$ (where Z is a dopant, a, b, and c are atomic ratios, 0≤a≤0.9, 0≤b≤0.9, 0≤c≤0.4, and a, b and c are not 0 at the same time). In the third material layer ML3, the dopant Z may include at least one element selected from Si, Cr, Al, Ta, Hf, Zr, Ni, V, Mo, P, C, W, Nb, Mn, and Ge and may be omitted if necessary. In example embodiments, the third material layer ML3 may have a structure oriented along a (001) crystal plane of a body-centered cubic (BCC) structure.

The fourth material layer ML4 may include at least one material selected from Ru, W, TiN, TaN, Ti, Ta, and a metallic glass alloy. For example, the fourth material layer ML4 may have a double layer structure of Ru/TiN or TiN/W.

Next, referring to FIGS. 2B, 5A, and 5B, the first to fourth material layers ML1, ML2, ML3, and ML4 may be etched using reactive ion beams RIB incident at a low angle (e.g., lower than the directional angle θap) with respect to the Z direction. According to some embodiments, the etching of the first to fourth material layers ML1, ML2, ML3, and ML4 may include forming an etch mask on the fourth material layer ML4 to pattern the fourth material layer ML4, and then etching the first to third material layers ML1, ML2, and ML3 by using the patterned fourth material layer ML4 as an etch mask.

Accordingly, a plurality of pinned layers PL horizontally separated from each other, a plurality of barrier layers BL horizontally separated from each other, a plurality of free layers FL horizontally separated from each other, and a plurality of upper electrodes TE horizontally separated from each other may be formed. In this case, scattered materials generated in a process of etching the first to third material layers ML1, ML2, and ML3 may be deposited on sidewalls of the plurality of pinned layers PL, the plurality of barrier layers BL, and the plurality of free layers FL, and thus, a bridge defect BD' may be generated. For example, the bridge defect BD' may connect patterns formed in different layers which are vertically stacked together as shown in FIG. 5B.

Subsequently, referring to FIGS. 2C, 5B, and 5C, the bridge defect BD' may be removed using reactive ion beams RIB incident at a high angle (e.g., higher than the directional angle θap) with respect to the Z direction. Accordingly, a short circuit failure of a semiconductor device manufactured through a subsequent process may be prevented, and the reliability of a method of manufacturing the semiconductor device may be improved.

In FIGS. 5A to 5C, a method of manufacturing a magnetic tunneling junction memory device including the plurality of pinned layers PL, the plurality of barrier layers BL, and the plurality of free layers FL has been illustrated. However, this is for illustration and the technical idea of the inventive concept is not limited thereto. A person of ordinary skill in the art may arrive at methods of manufacturing various types of semiconductor devices, such as etching at different angles of incidence, as in the manufacture of a phase change memory device and a ferroelectric memory device, based on the description herein.

Figure 7C:
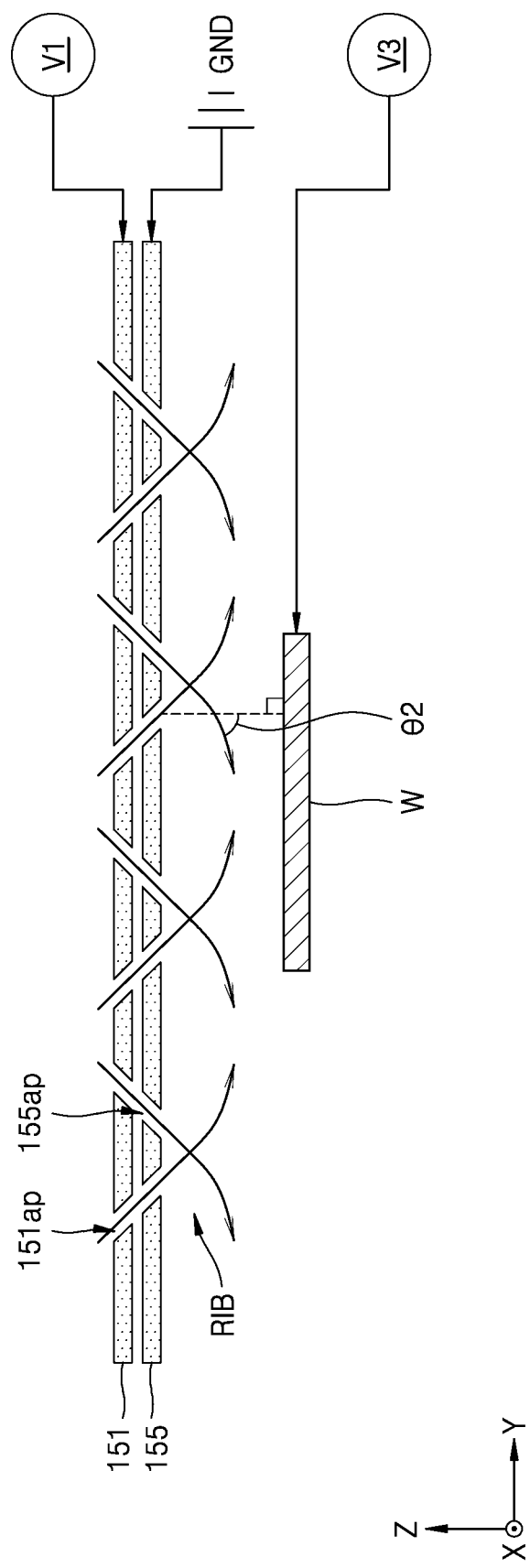

FIGS. 6 to 7C are diagrams illustrating a wafer processing apparatus 101 according to example embodiments.

For convenience of description, descriptions previously provided with reference to FIG. 1 will be omitted, and differences will be mainly described.

Referring to FIG. 6, the wafer processing apparatus 101 may include a chamber body 110, a wafer support 120, a gas inlet 131, a gas exhaust 135, a plasma generator 140, an RF power source 145, first and second electrodes 151 and 155, and first and third power sources 161 and 165.

In the wafer processing apparatus 101, unlike in the wafer processing apparatus 100 (see FIG. 1), a second power source for supplying power to the second electrode 155 may be omitted, and a reference potential GND may be applied to the second electrode 155. The reference potential GND may be the same as the potential of the chamber body 110, but is not limited thereto.

Referring to FIG. 7A, a first voltage V1 applied to the first electrode 151 may be higher than the reference potential GND, and thus, positive ions in plasma may be accelerated between the first electrode 151 and the second electrode 155 to form reactive ion beams RIB. When a third voltage V3 applied to a wafer W is substantially the same as the reference potential GND, an electric field may not be substantially formed (or zero electric field may be formed) between the second electrode 155 and the wafer W, and the reactive ion beams RIB incident on the wafer W may travel substantially straight between the second electrode 155 and the wafer W. Accordingly, the reactive ion beams RIB may enter/hit the wafer W at an angle the same as the directional angle θap of apertures 151ap and 155ap formed in the first and second electrodes 151 and 155.

Referring to FIG. 7B, the first voltage V1 may be higher than the reference potential GND as in FIG. 7A, and positive ions of the plasma may be accelerated due to a difference between the first voltage V1 and the reference potential GND to form reactive ion beams RIB. The third voltage V3 may be lower than the reference potential GND, and an electric field toward the wafer W may be formed between the second electrode 155 and the wafer W. Accordingly, the reactive ion beams RIB may be accelerated in a direction approaching the wafer W along the Z direction, and a first angle θ1, which is an angle between the Z direction and an incidence direction of the reactive ion beams RIB, may be less than the directional angle θap (refer to FIG. 7A) of the apertures 151ap and 155ap.

Referring to FIG. 7C, the first voltage V1 may be higher than the reference potential GND as in FIG. 7A, and positive ions of the plasma may be accelerated due to a difference between the first voltage V1 and the reference potential GND to form reactive ion beams RIB. The third voltage V3 may be higher than the reference potential GND, and an electric field in an direction receding from the wafer W may be formed between the second electrode 155 and the wafer W. Accordingly, the reactive ion beams RIB may be decelerated with respect to a direction approaching the wafer W in the Z direction, and a second angle θ2, which is an angle between the Z direction and an incidence direction of the reactive ion beams RIB, may be greater than the directional angle θap (refer to FIG. 7A) of the apertures 151ap and 155ap.

Figure 8:
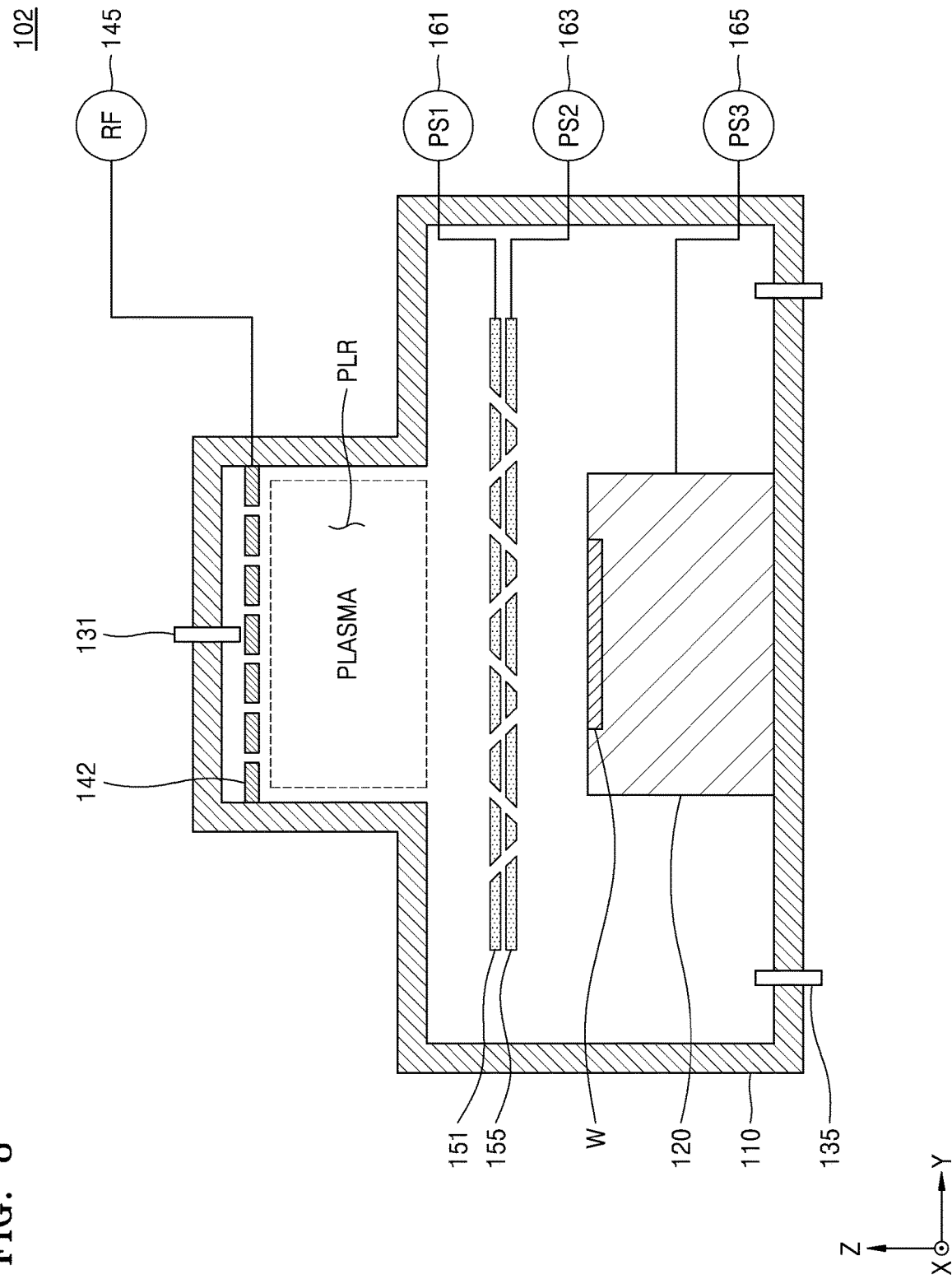
FIG. 8 is a diagram illustrating a wafer processing apparatus according to example embodiments.

FIG. 8 is a diagram illustrating a wafer processing apparatus 102 according to example embodiments.

For convenience of description, descriptions previously provided with reference to FIG. 1 will be omitted, and differences will be mainly described.

Referring to FIG. 8, the wafer processing apparatus 102 may include a chamber body 110, a wafer support 120, a gas inlet 131, a gas exhaust 135, a plasma generator 142, an RF power source 145, first and second electrodes 151 and 155, and first and third power sources 161 and 165.

According to example embodiments, the wafer processing apparatus 102 may be a capacitively coupled plasma (CCP) facility. Accordingly, the plasma generator 142 may have the form of an electrode. The plasma generator 142 may receive RF power from the RF power source 145 and form a high-frequency electric field in a plasma region PLR, and accordingly, plasma may be generated in the plasma region PLR by the high-frequency electric field.

Figure 9:
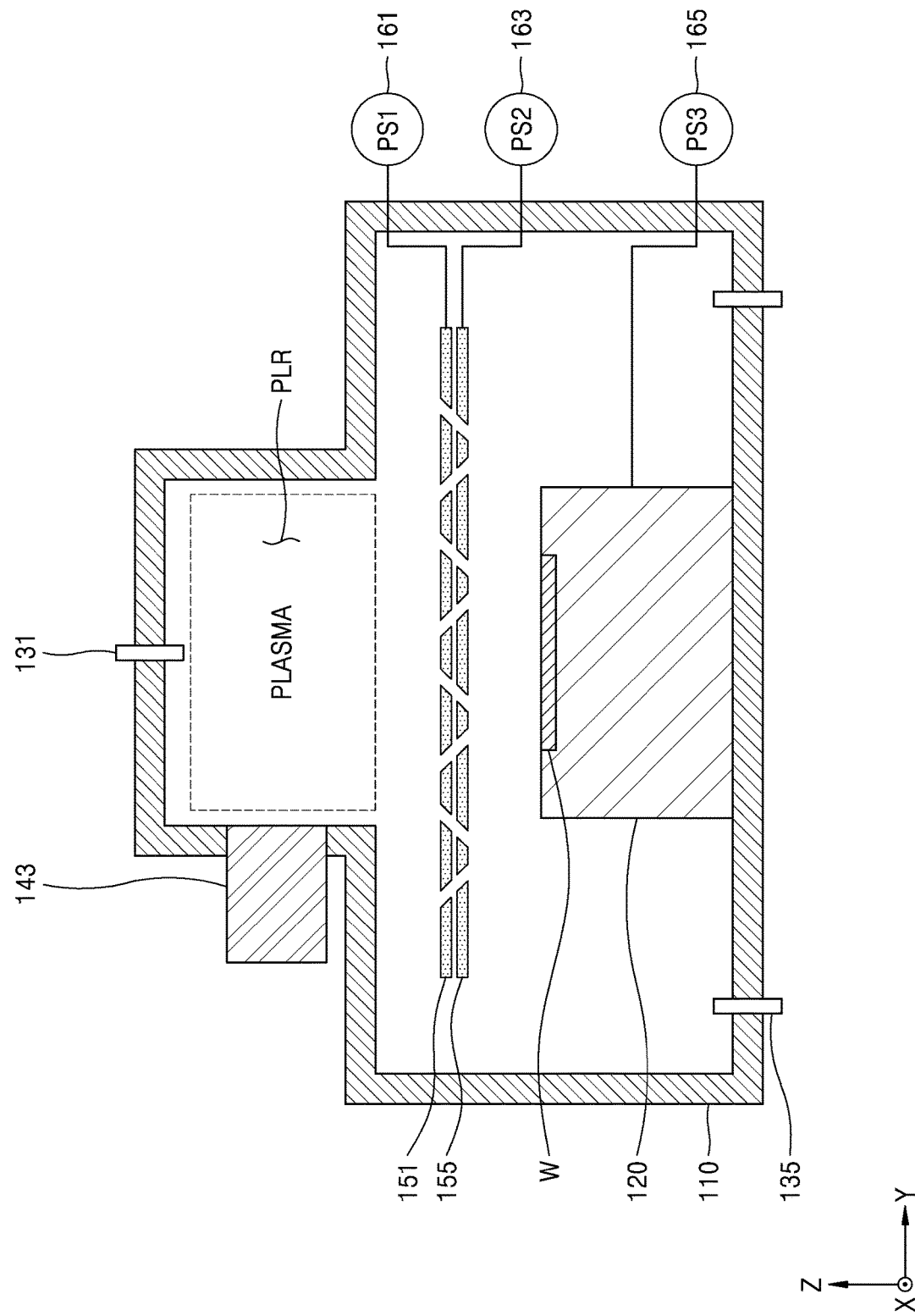
FIG. 9 is a diagram illustrating a wafer processing apparatus according to example embodiments.

FIG. 9 is a diagram illustrating a wafer processing apparatus 103 according to example embodiments.

For convenience of description, descriptions previously provided with reference to FIG. 1 will be omitted, and differences will be mainly described.

Referring to FIG. 9, the wafer processing apparatus 103 may include a chamber body 110, a wafer support 120, a gas inlet 131, a gas exhaust 135, a plasma generator 143, an RF power source 145, first and second electrodes 151 and 155, and first and third power sources 163 and 165.

The wafer processing apparatus 103 may be a microwave plasma facility, e.g., including a microwave plasma generator. The wafer processing apparatus 103 is similar to the wafer processing apparatus 100 (see FIG. 1), but may include the plasma generator 143 implemented with a waveguide.

The plasma generator 143 may introduce microwaves generated externally into a plasma region PLR. Microwaves introduced by the plasma generator 143 may be generated by, for example, a patch antenna, a dipole antenna, a monopole antenna, a microstrip antenna, a slot antenna, a yagi antenna, or the like. According to example embodiments, because the plasma is generated by external microwaves, the RF power source 145 (see FIG. 1) may be omitted.

In the above, wafer processing apparatuses based on an inductively coupled plasma (ICP) source, a capacitively coupled plasma (CCP) source, and a microwave plasma source have been described. However, based on the above descriptions, a person of ordinary skill in the art may easily achieve a plasma facility in which a low-angle and high-angle etching process may be performed by using plasma formed by any one of an electron cyclotron resonance (ECR) plasma source, a helicon-wave excited plasma (HWEP) source, and an adaptively coupled plasma (ACP) source.

While the inventive concept has been particularly shown and described with reference to embodiments thereof, it will be understood that various changes in form and details may be made therein without departing from the spirit and scope of the following claims.

What is claimed is:

1. A wafer processing apparatus comprising:
   a chamber body defining a plasma region configured that plasma is generated in the plasma region;
   a wafer support arranged in the chamber body and configured to support a wafer;
   first and second electrodes arranged between the wafer support and the plasma region and each having apertures configured to guide a path of ions of the plasma, wherein the first and second electrodes are flat and parallel to each other and the apertures of the first electrode are misaligned with the apertures of the second electrode;
   a first power source configured to apply, to the first electrode, a voltage that is higher than a voltage applied to the second electrode; and
   a second power source configured to apply, to the wafer support, a voltage that is higher than the voltage applied to the second electrode, wherein the wafer processing apparatus is configured that the first power source accelerates the ions to generate a plurality of reactive ion beams, each of the plurality of reactive ion beams traveling through a respective one of the apertures,
   wherein a first aperture in the first electrode and a second aperture in the second electrode form a first pair of apertures, wherein the first aperture is disposed directly above the second aperture, and a third aperture in the first electrode and a fourth aperture in the second electrode form a second pair of apertures, wherein the third aperture is disposed directly above the fourth aperture, and
   wherein a central direction of travel of a reactive ion beam traveling through the first pair of apertures is different from a central direction of travel of a reactive ion beam simultaneously traveling through the second pair of apertures such that the reactive ion beam traveling through the first pair of apertures intersects the reactive ion beam traveling through the second pair of apertures after passing through the first and second electrodes.

2. The wafer processing apparatus of claim 1, wherein the wafer processing apparatus is configured that the second power source controls a path of each of the plurality of reactive ion beams.

3. The wafer processing apparatus of claim 1, wherein the wafer processing apparatus is configured that the second power source makes a path of each of the plurality of reactive ion beams not parallel with an extending direction of the apertures.

4. The wafer processing apparatus of claim 1, wherein the wafer processing apparatus is configured that a voltage applied to the first electrode by the first power source is higher than a voltage applied to the wafer support by the second power source.

5. The wafer processing apparatus of claim 1, further comprising:
   a third power source configured to apply, to the second electrode, a third voltage that is different from a reference potential applied to the chamber body.

6. The wafer processing apparatus of claim 1, wherein the second power source is further configured to apply, to the wafer support, a voltage that is lower than a voltage applied to the second electrode.

7. The wafer processing apparatus of claim 1, wherein the wafer processing apparatus includes any one of a capacitively coupled plasma (CCP) generator, an inductively coupled plasma (ICP) generator, and a microwave plasma generator.

8. The wafer processing apparatus of claim 1, further comprising:
   a plasma generator configured to apply a magnetic or electric field to the plasma region; and
   a radio frequency (RF) power source configured to supply RF power to the plasma generator.

9. The wafer processing apparatus of claim 1, wherein the first and second electrodes are configured to move in a direction parallel to an upper surface of the wafer.

10. A wafer processing apparatus configured to perform a wafer etching process using a reactive ion beam, the wafer processing apparatus comprising:
    a chamber body defining a chamber, the chamber body configured that a wafer is arranged in the chamber, the chamber body defining a plasma region configured that plasma is generated in the plasma region;
    first and second electrodes arranged between the plasma region and a wafer support configured to receive the wafer, each of the first and second electrodes having apertures configured to guide a path of ions of the plasma, wherein the first and second electrodes are flat and parallel to each other and the apertures of the first electrode are misaligned with the apertures of the second electrode;
    a radio frequency (RF) power source configured to provide RF power to generate the plasma;
    a first power source configured to apply a first voltage to the first electrode to generate the reactive ion beam by accelerating positive ions of the plasma; and
    a second power source configured to apply a second voltage to the wafer to control a path of the reactive ion beam,
    wherein the wafer processing apparatus is configured that the first power source accelerates the ions to generate a plurality of reactive ion beams, each of the plurality of reactive ion beams traveling through a respective one of the apertures,
    wherein a first aperture in the first electrode and a second aperture in the second electrode form a first pair of apertures, wherein the first aperture is disposed directly above the second aperture, and a third aperture in the first electrode and a fourth aperture in the second electrode form a second pair of apertures, wherein the third aperture is disposed directly above the fourth aperture, and
    wherein a central direction of travel of a reactive ion beam traveling through the first pair of apertures is different from a central direction of travel of a reactive ion beam simultaneously traveling through the second pair of apertures such that the reactive ion beam traveling through the first pair of apertures intersects the reactive ion beam traveling through the second pair of apertures after passing through the first and second electrodes.

11. The wafer processing apparatus of claim 10, wherein the second voltage is less than the first voltage.

12. The wafer processing apparatus of claim 10, wherein the wafer processing apparatus is configured that the second power source applies, to the wafer, the second voltage that is higher than a voltage applied to the second electrode to control a path of each of the plurality of reactive ion beams so that the reactive ion beam is incident on the wafer at an angle greater than an angle of a central axis of the apertures with respect to a first direction perpendicular to an upper surface of the wafer.

13. The wafer processing apparatus of claim 10, wherein the wafer processing apparatus is configured that the second power source applies, to the wafer, the second voltage that is lower than a voltage applied to the second electrode to control a path of each of the plurality of reactive ion beams so that the reactive ion beam is incident on the wafer at an angle less than an angle of a central axis of the apertures with respect to a first direction perpendicular to an upper surface of the wafer.

14. The wafer processing apparatus of claim 10, wherein the wafer processing apparatus is configured that a reference potential is applied to the chamber body and the second electrode.

15. The wafer processing apparatus of claim 10, further comprising:
 a third power source configured to apply, to the second electrode, a third voltage that is different from a reference potential applied to the chamber body.

16. A wafer processing apparatus configured to make a reactive ion beam be incident on a wafer at first to third angles with respect to a first direction perpendicular to an upper surface of the wafer, the wafer processing apparatus comprising:
 a chamber body defining a plasma region configured that plasma is formed in the plasma region;
 a wafer support arranged in the chamber body and configured to support and fix the wafer;
 first and second electrodes arranged between the wafer support and the plasma region and each having apertures configured to guide a path of ions of the plasma, wherein the first and second electrodes are flat and parallel to each other and the apertures of the first electrode are misaligned with the apertures of the second electrode;
 a first power source electrically connected to the first electrode; and
 a second power source electrically connected to the wafer support,
 wherein the second power source is configured to apply voltages of at least three different levels to the wafer through the wafer support,
 wherein the wafer processing apparatus is configured that the first power source accelerates the ions to generate a plurality of reactive ion beams, each of the plurality of reactive ion beams traveling through a respective one of the apertures,
 wherein a first aperture in the first electrode and a second aperture in the second electrode form a first pair of apertures, wherein the first aperture is disposed directly above the second aperture, and a third aperture in the first electrode and a fourth aperture in the second electrode form a second pair of apertures, wherein the third aperture is disposed directly above the fourth aperture, and
 wherein a central direction of travel of a reactive ion beam traveling through the first pair of apertures is different from a central direction of travel of a reactive ion beam simultaneously traveling through the second pair of apertures such that the reactive ion beam traveling through the first pair of apertures intersects the reactive ion beam traveling through the second pair of apertures after passing through the first and second electrodes.

17. The wafer processing apparatus of claim 16, wherein the wafer processing apparatus configured that the second power source applies, to the wafer, a voltage that is equal to the voltage applied to the second electrode so that each of the plurality of reactive ion beams enters the wafer at the first angle equal to an angle of a central axis of the apertures.

18. The wafer processing apparatus of claim 16, wherein the wafer processing apparatus configured that the second power source applies, to the wafer, a voltage that is higher than the voltage applied to the second electrode so that each of the plurality of reactive ion beams enters the wafer at the second angle that is greater than an angle of a central axis of the apertures.

19. The wafer processing apparatus of claim 16, wherein the wafer processing apparatus configured that the second power source applies, to the wafer, a voltage that is lower than the voltage applied to the second electrode so that each of the plurality of reactive ion beams enters the wafer at the third angle that is less than an angle of a central axis of the apertures.

20. The wafer processing apparatus of claim 1, wherein a divergence of each reactive ion beam is adjusted by adjusting the voltage applied to the wafer support by the second power source.

* * * * *